US010997326B2

(12) United States Patent
Hinkley et al.

(10) Patent No.: US 10,997,326 B2
(45) Date of Patent: May 4, 2021

(54) TIME-TO-FINISH SIMULATION FORECASTER

(71) Applicant: HALLIBURTON ENERGY SERVICES, INC., Houston, TX (US)

(72) Inventors: Richard Edward Hinkley, Houston, TX (US); Terry Wayne Wong, Houston, TX (US); Graham Christopher Fleming, Houston, TX (US); Amit Kumar, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 389 days.

(21) Appl. No.: 15/748,416

(22) PCT Filed: Sep. 4, 2015

(86) PCT No.: PCT/US2015/048483
§ 371 (c)(1),
(2) Date: Jan. 29, 2018

(87) PCT Pub. No.: WO2017/039680
PCT Pub. Date: Mar. 9, 2017

(65) Prior Publication Data
US 2018/0218098 A1 Aug. 2, 2018

(51) Int. Cl.
*G01V 99/00* (2009.01)
*G06F 30/20* (2020.01)
(Continued)

(52) U.S. Cl.
CPC ............ *G06F 30/20* (2020.01); *G01V 99/005* (2013.01); *G06F 9/455* (2013.01); *E21B 43/00* (2013.01); *G06Q 50/06* (2013.01)

(58) Field of Classification Search
CPC ... G01V 99/005; E21B 43/00; G06F 11/3409; G06F 30/20; G06F 9/455; G06Q 50/06
(Continued)

(56) References Cited

U.S. PATENT DOCUMENTS 5,679,893 A * 10/1997 Masoner ................. E21B 47/00
73/152.18
7,640,149 B2 12/2009 Rowan et al.
(Continued)

FOREIGN PATENT DOCUMENTS

JP           09016244 A     1/1997
WO     2015019077 A1   2/2015
(Continued)

OTHER PUBLICATIONS

Al-Shaikh et al., "Toward building green computing environment for reservoir simulation", 2013, 4th Annual International Conference on Energy Aware Computing Systems and Applications (ICEAC), IEEE, pp. 75-80.*
(Continued)

*Primary Examiner* — Juan C Ochoa
(74) *Attorney, Agent, or Firm* — Polsinelli PC

(57) ABSTRACT

Systems, methods, and computer-readable media for forecasting a time to complete a simulation of a reservoir simulation model. A processor can run a simulation of a reservoir simulation model for a first predetermined period of time associated with a first computation step of the simulation. The processor can measure a performance result of the simulation for the first predetermined period of time. The performance result can include an elapsed wall clock time and a timespan simulated. The processor can then forecast a remaining time to complete the simulation of the reservoir simulation model based on the performance result.

20 Claims, 7 Drawing Sheets

(51) Int. Cl.
*G06F 9/455* (2018.01)
*G06Q 50/06* (2012.01)
*E21B 43/00* (2006.01)

(58) Field of Classification Search
USPC .................................................... 703/10, 2
See application file for complete search history.

(56) References Cited

U.S. PATENT DOCUMENTS

| | | | |
|---|---|---|---|
| 7,877,246 B2 | 1/2011 | Moncorge et al. | |
| 8,417,489 B2* | 4/2013 | Benayon | G06F 17/10 |
| | | | 703/17 |
| 8,630,836 B2 | 1/2014 | Wasser | |
| 8,689,227 B2 | 4/2014 | Blanding et al. | |
| 8,869,158 B2 | 10/2014 | Prabhakar et al. | |
| 8,949,847 B2 | 2/2015 | Kim et al. | |
| 9,026,417 B2 | 5/2015 | Sequeira, Jr. et al. | |
| 2002/0059427 A1 | 5/2002 | Tamaki et al. | |
| 2002/0143497 A1 | 10/2002 | Roser et al. | |
| 2011/0077922 A1 | 3/2011 | Moncorge et al. | |
| 2012/0101791 A1 | 4/2012 | Komatsu et al. | |
| 2012/0123764 A1 | 5/2012 | Ito et al. | |
| 2013/0218537 A1 | 8/2013 | Le Ravalec | |
| 2013/0246030 A1* | 9/2013 | Usadi | G06F 30/20 |
| | | | 703/10 |
| 2013/0325419 A1* | 12/2013 | Al-Shaikh | G06F 9/5066 |
| | | | 703/2 |
| 2015/0040131 A1 | 2/2015 | Shan et al. | |
| 2015/0058262 A1 | 2/2015 | Gorell et al. | |
| 2016/0061008 A1* | 3/2016 | Al-Turki | G06F 9/485 |
| | | | 703/10 |
| 2016/0188769 A1* | 6/2016 | Aylott | G06F 30/20 |
| | | | 703/6 |

FOREIGN PATENT DOCUMENTS

| | | |
|---|---|---|
| WO | 2015019078 A1 | 2/2015 |
| WO | 2015084297 A1 | 6/2015 |

OTHER PUBLICATIONS

Freeh et al., "Exploring the Energy-Time Tradeoff in MPI Programs on a Power-Scalable Cluster", Apr. 2005, Proceedings of the 19th International Conference on Parallel and Distributed Processing Symposium (IPDPS'05), 10 pages.*
Al-Shaikh et al., "Towards Building Scalable Grid Computing Environments for Reservoir Simulation", 2013, 8th EUROSIM Congress on Modelling and Simulation, Cardiff, pp. 573-578.*
International Search Report and Written Opinion; PCT Application No. PCT/US2015/048483; dated May 23, 2016.
French Search Report; French Application No. 1657479; dated Aug. 20, 2018.
Examiner's Letter; Canadian Application No. 2,994,529; dated May 1, 2020.

* cited by examiner

TIME-TO-FINISH SIMULATION FORECASTER

CROSS-REFERENCE TO RELATED APPLICATIONS

This application is a national stage entry of PCT/US2015/048483 filed Sep. 4, 2015, said application is expressly incorporated herein in its entirety.

TECHNICAL FIELD

The present technology pertains to forecasting models and more specifically to forecasting the time to finish a simulation of a reservoir simulation model.

BACKGROUND

Increased energy demands and the depletion of hydrocarbon resources have escalated the need for complex reservoir studies. To plan the optimal development of an oil or gas field, engineers have turned to software modeling of reservoirs, wells, and surface facilities in order to assess the deliverability of hydrocarbons from one or more reservoirs to the point of sale. However, despite advancements in computer technology and improvements to software performance, simulations of these complex models can take multiple days to complete. Therefore, a mechanism for forecasting simulation times would be advantageous for allocating computer resources and planning reservoir engineering analysis and activities, for example.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Figure 1:
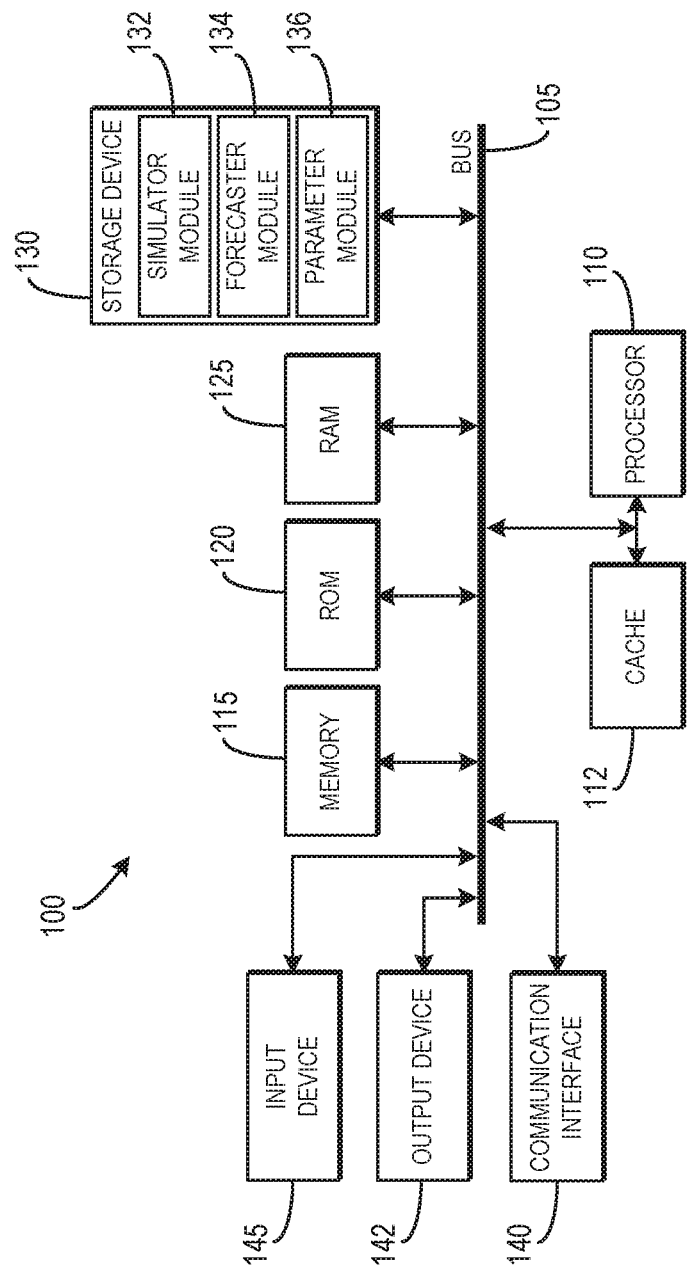
FIG. 1 illustrates a schematic diagram of example system embodiment of a time-to-finish-simulation forecaster.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

The approaches set forth herein can be used to provide a prospective and continuously updated estimate of the time required to finish a simulation of a reservoir model. During model construction, the estimate can account for model complexities and computing resources and can aid in accessing the relative impact of different modeling choices on simulation runtime. Once the simulation has begun, the estimate can utilize actual simulation performance and can provide more useful monitoring of simulation progress. A simulation model complexity (SMC) score can also be generated at each stage of model construction. The SMC score can account for various model characteristics and can provide an assessment of the level of support needed to interpret the results of the simulation.

Disclosed are systems, methods, and computer-readable storage media for forecasting a time to complete a simulation of a reservoir simulation model. A processor can run a simulation of a reservoir simulation model for a first predetermined period of time associated with a first computation step of the simulation. The processor can measure a performance result of the simulation for the first predetermined period of time. The performance result can include an elapsed wall clock time and a timespan simulated. The processor can then forecast a remaining time (e.g. through extrapolation, moving averages, probabilistic models, etc.) to complete the simulation of the reservoir simulation model based on the performance result.

Prior to running the simulation, the processor can determine one or more characteristics associated with an oil or gas field. The oil or gas field can include one or more of a reservoir, a well, and/or a surface facility. Further, the characteristics can be calculated by the processor based on data sensed via one or more sensors. The processor can generate a reservoir simulation model based on one or more of the characteristics.

Next, the processor can determine one or more parameters from the reservoir simulation model. The processor can then calculate an estimated time to complete the simulation of the reservoir simulation model based on one or more of the parameters. If a change in one or more of the parameters is detected, the processor can update the estimated time to complete the simulation of the reservoir simulation model based on the change. This can improve the processing of the system and the efficiency of the simulation. The processor can also use one or more of the parameters to calculate a simulation model complexity score.

FIG. 1 illustrates an example system embodiment of a reservoir simulation system having a time-to-finish-simulation forecaster. Reservoir simulation system 100 can include one or more processing units 110 and a system bus 105 that couples various system components, such as system memory 115, read only memory (ROM) 120, and random access memory (RAM) 125, to the processor 110. The system 100 can include a cache of high-speed memory connected directly with, in close proximity to, or integrated as part of the processor 110. The system 100 can copy data from the memory 115 and/or the storage device 130 to the cache 112 for quick access by the processor 110. In this way, the cache can provide a performance boost that avoids processor 110 delays while waiting for data. The processor 110 can include one or more general purpose processors and a hardware module or software module, such as reservoir simulator module 132, forecaster module 134, and parameter module 136 stored in storage device 130. These and other modules can control or be configured to control the processor 110 to perform various actions, including execution of the time-to-finish-simulation forecaster as disclosed herein. Processor 110 can also include one or more special-purpose processors where software instructions are incorporated into the actual processor design.

To enable user interaction with the reservoir simulation system 100, an input device 145 can represent any number of input mechanisms, such as a microphone for speech, a touch-sensitive screen for gesture or graphical input, keyboard, mouse, motion input, and so forth. An output device 142 can also be one or more of a number of output mechanisms known to those of skill in the art, such as a display, a speaker and so forth. In some instances, multimodal systems can enable a user to provide multiple types of input to communicate with the reservoir simulation system 100. There is no restriction on operating on any particular hardware arrangement and therefore the basic features here may easily be substituted for improved hardware or firmware arrangements as they are developed.

Reservoir simulation system 100 can also include one or more communication interfaces 140 that can have different physical interfaces. The communication interfaces 140 can include any type of communication channel, connector, data communication network, or other link. For example, the communication interfaces 140 can include a wireless or a wired network, a Local Area Network (LAN), a Wide Area Network (WAN), a private network, a public network (such as the Internet), a WiFi network, a network that includes a satellite link, or another type of data communication network.

Storage device 130 can be a non-volatile memory and can be a hard disk or other types of computer readable media which can store data that are accessible by a computer, such as magnetic cassettes, flash memory cards, solid state memory devices, digital versatile disks, cartridges, random access memories (RAMs) 125, read only memories (ROMs) 120, and hybrids thereof. The storage device 130 can be connected directly to the system bus 105 or can communicate wirelessly with the various components in system 100. As previously discussed, the storage device 130 can include reservoir simulator module 132, forecaster module 134, and parameter module 136, although other hardware or software modules are contemplated. The modules can include machine-readable instructions that can be interpreted or executed by the processor 110 for performing one or more of the operations related to FIGS. 2-6. The modules can include machine-readable instructions for generating a graphical user interface (GUI) of a reservoir simulator having a time-to-finish-simulation forecaster. The modules can receive input data, such as data used to generate a reservoir model, simulate a reservoir model, forecast a time to complete a simulation of a reservoir model, or any other type of data, from the memory 115, ROM 120, RAM 135, storage device 130, from another local source, from input device 145, or from one or more remote sources (e.g., via the communication interfaces 140). The modules can generate output data and store the output data in the memory 115, ROM 120, RAM 135, storage device 130, in another local medium, or in one or more remote devices (e.g., by sending the output data via the communication interfaces 140). In one aspect, a hardware module that performs a particular function can include the software component stored in a computer-readable medium in connection with the necessary hardware components, such as the processor 110, bus 105, output device 142, and so forth, to carry out the function.

Reservoir simulator module 132 can contain software instructions executable by processor 110 to generate a GUI for rendering and simulating a reservoir model. Through use of the GUI, a user may enter data to generate a reservoir model. Data used to generate the model can be obtained, for example, by using equipment or sensors to perform or obtain measurements from an oil or gas field drill site, from data stored within reservoir module 132 or another local or remote source, and the like. Reservoir module 132 may also store (or download from a remote location) historical and real-time reservoir related data that spans across various aspects of the well planning, construction and completion processes such as, for example, drilling, cementing, wireline logging, well testing and stimulation. Moreover, such data may include, for example, open hole logging data, well trajectories, petrophysical rock property data, surface data, fault data, data from surrounding wells, data inferred from geostatistics, etc.

At each step of generating the reservoir model, a parameter module 136 can collect various parameters and characteristics related to the model complexities as well as the number and type of processors 110 and other local or remote computer resources used by the reservoir simulation system 100. Forecaster module 134 can use the parameters and/or characteristics collected by parameter module 136 to calculate, by processor 110, an estimate of the time to complete a simulation of the reservoir model. Forecaster module 134 can also use the parameters and/or characteristics to calculate a simulation model complexity (SMC) score. The estimated time and SMC score can be stored and communicated to processor 110 and/or reservoir simulator module 132 to display the estimated time to the user, such as within the GUI. If, at any point, a change is detected in one or more parameters or characteristics of the reservoir model, parameter module 136 can update the collected parameters and characteristics to reflect the change. Forecaster module 134 can then use the updated parameters and/or characteristics to recalculate the estimate of the time to complete a simulation of the reservoir model and the SMC score and can store and communicate the recalculated estimate and SMC score to processor 110 and/or reservoir simulator module 132 for display in the GUI.

The GUI generated by processor 110 using instructions stored in reservoir simulator module 132 can also allow a user to launch a simulation of the reservoir model, monitor the simulation run, analyze the results of the simulation, and the like. When the simulation is launched, forecaster module 134 can measure a performance result of the simulation for a predetermined period of time associated with a computation step of the simulation. Forecaster module 134 can utilize the performance result to forecast a remaining time to complete a simulation of the reservoir model and can store and communicate the forecasted time to processor 110 and/or reservoir simulator module 132 for display in the GUI. Forecaster module 134 can also react to the forecasted time, such as by requesting an increase or allowing a decrease in computing power allocated for the simulation. Forecaster module 134 can repeat the above steps for subsequent computation steps of the simulation as described in FIG. 3 to update the previously forecasted time or to forecast a new remaining time to complete a simulation of the reservoir model.

Although a specific configuration of a reservoir simulation system having a time-to-finish-simulation forecaster is depicted in FIG. 1, it will be apparent to those of ordinary skill in the art that different configurations are possible without departing from the scope of the present disclosure. It can be appreciated that reservoir simulation system 100 can have more than one processor 110 or be part of a group or cluster of computing devices networked together to provide greater processing capability. The reservoir simulation system can use any number of computer-systems and computer networks and can realize various different computing model infrastructures, such as cloud computing, distributed computing and grid computing infrastructures. Program modules, such as reservoir simulator module 132, forecaster module 134, and parameter module 136, may be located in other local and remote computer-storage media and/or memory and can be combined or divided into any number of individual modules.

Having disclosed some basic system components and concepts, the disclosure now turns to the example method embodiments shown in FIGS. 2-6. For the sake of clarity, the methods are described in terms of processor 110, as shown in FIG. 1, configured to practice the methods. The steps outlined herein can be implemented in any combination thereof, including combinations that exclude, add, or modify certain steps.

Figure 2:
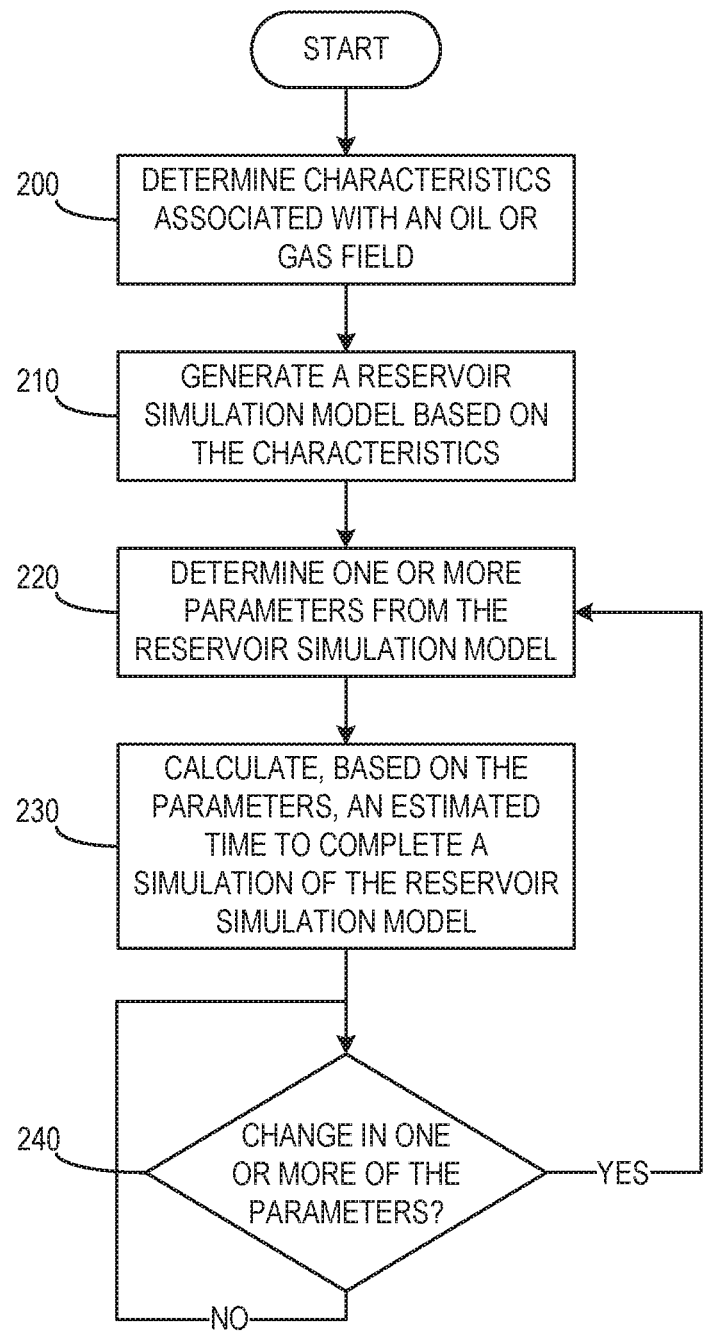
FIG. 2 illustrates an example process for generating a reservoir simulation model and estimating a time to complete a simulation.

FIG. 2 illustrates an example process for generating a reservoir simulation model and estimating a time to complete a simulation. At step 200, the processor 110 can determine one or more characteristics associated with an oil or gas field. The oil or gas field can include one or more of a reservoir, a well, and a surface facility. The determined characteristics can be based on data input or selected by a user, such as through one or more input device 145. The characteristics can also be based on data stored in local or remote databases and storage mediums. The data can include, for example, physical properties, material properties, geometrical properties, geological data, fluid data, fracture data, treatment data, and any other data necessary to define one or more reservoir, wellbore, surface facilities, and the surrounding region. The data can be obtained, for example, from measurements performed using equipment or sensors at an oil or gas field drill site, from geological studies or theoretical calculations, from databases stored in local and remote storage sources, and the like.

At step 210, the processor 110 can generate a reservoir simulation model based on the characteristics determined during step 200. The reservoir simulation model can include one or more of a reservoir model, a well model, a surface facilities model, a geological model, a geomechanical model, a fracture model, a flow model, and any other model necessary to assess the recoverability of hydrocarbons. The processor 110 can generate the reservoir simulation model to meet a user selection or preference. The reservoir simulation model can be rendered and displayed to the user, for instance through one or more output device 142.

At step 220, the processor 110 can determine one or more parameters from the reservoir simulation model. The parameters can include one or more of a number of components, a number of gridblocks, a number of processors or nodes, a simulation start time, a simulation end time, a timespan of a simulation of the reservoir simulation model, a hardware factor, a surface network complexity, a displacement type (e.g., waterflood, gasflood, near miscible, etc.), a well type (e.g., a water-and-gas well, a multilateral well, a smart well, a well with downhole devices, etc.), a level of well control, a pressure-volume-temperature type (e.g., black oil, gas-water, water-oil, American Petroleum Institute, equation of state, etc.), a relative permeability type (e.g., hysteresis, interfacial tension, near critical, etc.), a porosity type (e.g., single porosity, dual porosity, etc.), a geomechanical type (e.g., simple compressibility, compaction tables, coupled geomechanical model, etc.), a thermal type (e.g., single temperature, non-steam flash, full steam/water flash, etc.), a scaling factor, and a miscellaneous property of the reservoir simulation model. Data associated with the one or more determined parameters can be stored in a local or remote storage medium.

After determining the parameters, the processor 110 can use one or more of the parameters to calculate an estimated time to complete a simulation of the reservoir simulation model in step 230. The processor 110 can calculate the estimated time prior to running the simulation of the reservoir simulation model. The estimated time can be displayed to the user, for instance through one or more output device 142, and/or can be stored in a local or remote storage medium. As a non-limiting example, the estimated time can be calculated using equations (1) and (2) below, where TTFS is the time to finish the simulation in hours, NC is the number of components, NB is the number of gridblocks, NP is the number of processors or nodes, TSPAN is the timespan of the simulation in years, HW is the hardware factor, SNET is the surface network complexity, DISP is the displacement type, and ex1, ex2, ex3 and ex4 are exponent factors. The exponent factors ex1-4 can be simulator dependent and can be optimized based on information gained as the simulation progresses and/or results from previous simulations.

$$TTFS = \frac{(NC)^{ex1}(NB)^{ex2}(TSPAN)(HW)(SNET)(DISP)}{24(NP)} \text{ for } \frac{NB}{NP} > 10{,}000 \quad (1)$$

$$TTFS = \frac{(NC)^{ex3}(NB)^{ex4}(TSPAN)(HW)(SNET)(DISP)}{24} \text{ for } \frac{NB}{NP} \leq 10{,}000 \quad (2)$$

The processor 110 can also utilize one or more of the parameters to calculate a SMC score for the reservoir simulation model. The SMC score can include ranges which correspond to the complexity of the reservoir simulation model and can indicate the level of support necessary to interpret the results of the simulation of the reservoir simulation model. The SMC score can also be displayed to the user, for instance through one or more output device 142, and/or can be stored in a local or remote storage medium.

At step 240, the processor 110 can continuously monitor the reservoir simulation model to determine if a change is made to one or more of the parameters. If a change is detected, the processor 110 can proceed to step 220 to update the parameters of the reservoir simulation model to reflect the change. The processor 110 can then recalculate the estimated time to complete the simulation of the reservoir simulation model in step 230. The recalculated estimate can be displayed to the user, for instance through one or more output device 142, and/or can be stored in a local or remote storage medium.

Figure 3:
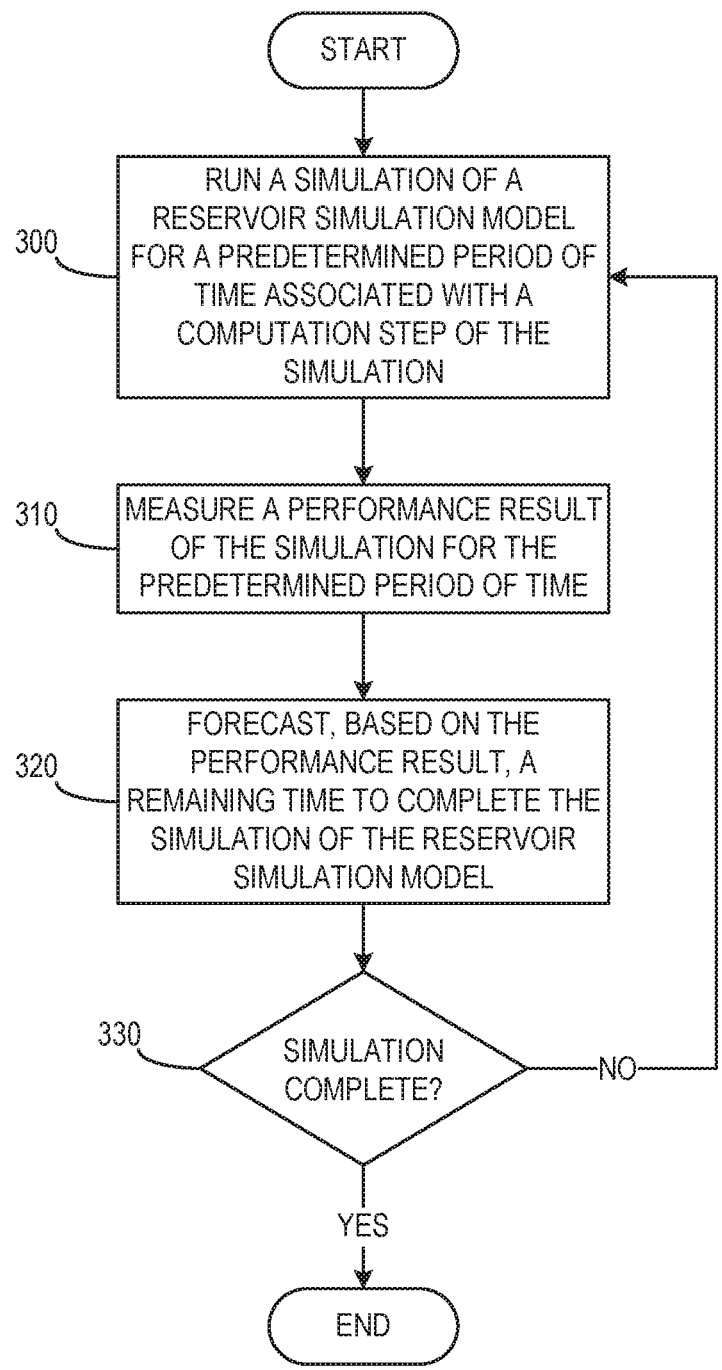
FIG. 3 illustrates an example process for running a simulation of a reservoir simulation model and forecasting a time to complete the simulation.

FIG. 3 illustrates an example process for running a simulation of a reservoir simulation model and forecasting a time to complete the simulation. At step 300, the processor 110 can run a simulation of a reservoir simulation model for a predetermined period of time associated with a computation step of the simulation. The computation step can be associated with a timestep of the simulation, one or more iterations of the simulation, a calculation, a function, a process, a stage or state of a simulation, a time, and the like. The processor 110 can provide one or more converged solutions to the simulation for the predetermined period of time, such as a converged solution to one or more Newton iterations. The criteria for convergence can be determined by processor 110 based on data input by a user, default values stored within a storage medium, and the like.

At step 310, the processor 110 can measure a performance result of the simulation for the predetermined period of time. The performance result can include one or more of an elapsed wall clock time, a timespan of the simulation that was simulated during the predetermined period of time, a number of iterations executed by the processor 110 during the predetermined period of time, a result related to the one or more converged solutions, and any other result indicative of the amount of computing time or power required to run the simulation of the reservoir simulation model for the predetermined period of time. The performance result can be stored in a local or remote storage medium.

At step 320, the processor 110 can use the measured performance result to forecast a remaining time to complete the simulation of the reservoir simulation model after the predetermined period of time. As a non-limiting example, the forecasted remaining time can be calculated through equation (3) below, where TTFS is the wall clock time remaining to finish the simulation, ET is the elapsed wall clock time, TSIM is the timespan simulated up to ET, and TSPAN is the total timespan of the simulation.

$$TTFS = ET\left(\frac{TSPAN}{TSIM} - 1\right) \quad (3)$$

The forecasted time can also be calculated by an extrapolation (e.g. linear, polynomial, etc.) of the performance result through the remainder of the simulation, a moving average of the performance result with one or more previously measured performance result, a comparison of the performance result to a database of performance results associated with previously executed simulations, a probabilistic model (e.g. stochastic model, Monte Carlo simulation, etc.), any combination thereof, and the like. The forecasted remaining time can be displayed to the user, for instance through one or more output device 142, and/or can be stored in a local or remote storage medium.

The processor 110 can also react to the forecasted remaining time. If the forecasted time is above a threshold, the processor 110 can prompt a user to modify, or can automatically modify, one or more parameters of the reservoir simulation model to produce an updated reservoir simulation model. Such a threshold can be set by the user or can be set by the processor 110. The processor 110 can then run a simulation of the updated reservoir simulation model for a predetermined period of time, measure a performance result of the simulation during the predetermined period of time, and forecast a remaining time to complete the simulation of the updated reservoir simulation model. The processor 110 can also notify a user of an expected or pending failure of a simulation based on the forecasted remaining time and/or information obtained from the calculation of the forecasted remaining time. Further, the processor 110 can allocate computing resources based on the forecasted remaining time, such as by requesting additional computing or processing power when the forecasted remaining time is above a maximum threshold, or allowing a decrease in computing or processing power when the forecasted remaining time is below a minimum threshold.

At step 330, processor 110 can determine if the simulation of the reservoir simulation model is complete. If the simulation is not complete, processor 110 can return to step 300 and run the simulation of the reservoir simulation model for a subsequent predetermined period of time associated with a subsequent computation step of the simulation. From here, the processor 110 can measure a performance result of the simulation during the subsequent predetermined period of time and can update the forecasted remaining time to complete the simulation of the reservoir simulation model as discussed above. The updated forecasted remaining time can be displayed to the user, for instance through one or more output device 142, and/or can be stored in a local or remote storage medium.

Once the simulation is complete, the processor 110 can provide the results of the simulation to the user and/or store the results in a local or remote storage medium. The processor 110 can also provide a summary of the estimated time to complete the simulation calculated prior to running the simulation and the forecasted time to complete the simulation calculated while running the simulation to the user. The processor 110 can store all calculations of the estimated time, forecasted time, and performance results in a local or remote storage medium or database. This stored data can be analyzed (e.g. through machine learning) and utilized by the processor 110 in future simulations to increase the accuracy of the estimated and forecasted times to complete a simulation of a reservoir simulation model. The processor 110 can also provide the results of the simulation to sensors or equipment located at a prospective or previously constructed oil or gas field drill site for execution of or adjustments to drilling operations.

Figure 4:
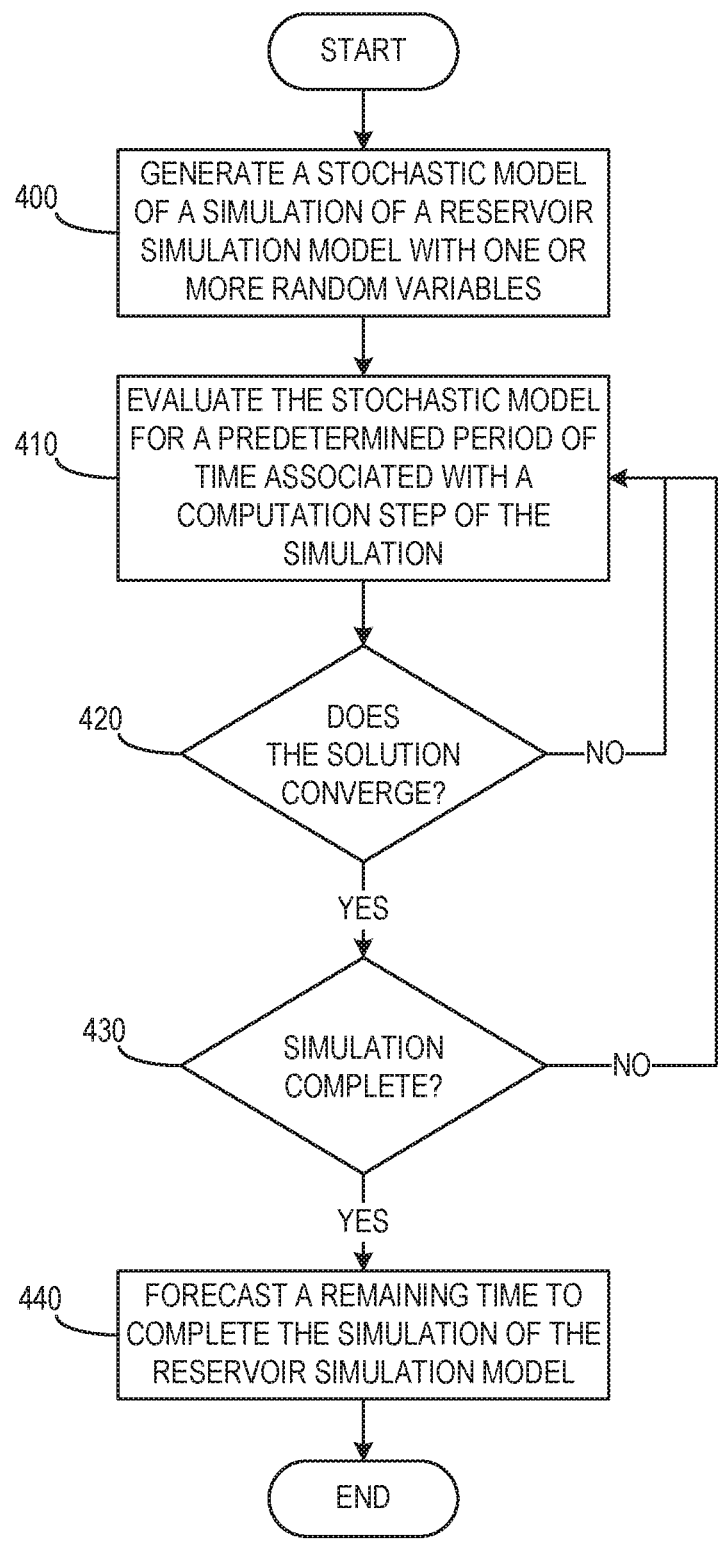
FIG. 4 illustrates an example process for forecasting a time to complete a simulation based on a stochastic model.

FIG. 4 illustrates an example process for forecasting a time to complete a simulation based on a stochastic model. In general, the process can provide a stochastic model of the progress of the simulation in terms of a relationship between a wall clock time and a simulated time. Moreover, the process can stochastically model the relationship of the wall clock time and the simulated time between a given simulation start time and a given simulation end time to provide an estimated wall clock time to complete the simulation and/or a percentage of the simulation that has been completed. Such a process can be used, for example, when calculating an estimated time to complete a simulation of a reservoir simulation model prior to running the simulation, and when forecasting a time remaining to complete a simulation of a reservoir simulation model while running the simulation. In either situation, the processor 110 can generate and evaluate the stochastic model one or more times for each predetermined period of time associated with a computation step of the simulation. The one or more evaluations of the stochastic model can predict the simulation process to the end time of the simulation and can obtain an estimate of the total wall clock time remaining to complete the simulation of the reservoir simulation model. If the stochastic model is evaluated more than once, the estimates of the total wall clock time remaining to complete the simulation obtained during each evaluation can be averaged to improve the estimation accuracy.

The process of FIG. 4 can begin at step 400 with processor 110 generating a stochastic model of a simulation of a reservoir simulation model having one or more random variables. As previously discussed, the stochastic model can be used to model the progress of the simulation in terms of a relationship between a wall clock time and a simulated time, given a simulation start time and a simulation end time. The random variables can correspond to one or more of a prediction of convergence or non-convergence of the simulation, a number of iterations taken to reach convergence, a fraction of a computation step to be attempted as a new computation step upon non-convergence of the simulation, a wall clock time taken to provide a solution to one or more iterations of the simulation, the reservoir simulation model (e.g. a timespan of the simulation, etc.), the simulation itself (e.g. an elapsed wall clock time of the simulation, etc.), a result of a computation step of the simulation (e.g. a measured performance result, etc.), and the like. The stochastic model can also include other variables and/or constant scalar values such as one or more of a maximum and minimum size of a computation step, a maximum number of iterations allowed to complete a computation step, a growth factor of a computation step, a maximum and minimum chopping factor of a computation step, an elapsed wall clock time, an increment of elapsed wall clock time, a mean wall clock time taken to solve one iteration of a computation step, a standard deviation of wall clock time taken to solve one iteration of a computation step, a simulation start time, a simulation end time, a total simulated time, and the like. Each of the random variables, other variables, and/or constant scalar values can be initialized upon generation of the stochastic model based on data input by a user, default values stored within a storage medium, and the like.

At step 410, the processor 110 can evaluate the stochastic model for a predetermined period of time associated with a computation step of the simulation. The evaluation of the stochastic model can include performing calculations related to one or more of the random variables, other variables, and scalar constant values of the stochastic model to estimate a wall clock time taken to complete the simulation of the predetermined period of time. The evaluation can also perform calculations to predict if the solution to the simulation during the current predetermined period of time reaches convergence. The calculations performed during the evaluation of the stochastic model, such as those calculations done to determine a solution to the random variables, can utilize actual or calculated values determined during one or more previous predetermined period of times, can assume a probability distribution of one or more of the variables (e.g. a discrete uniform distribution, Bayesian probability, etc.), any combination thereof, and the like. Each of the calculations and their results can be displayed to the user and/or stored in a local or remote storage medium.

At step 420, the processor 110 can check if the solution to the simulation during the current predetermined period of time reaches convergence based on the calculation carried out in step 410. If the solution does not converge, the processor 110 can decrease or chop the predetermined period of time by a calculated or user-determined chopping factor. The chopping factor can have a minimum or maximum value so that the chopped predetermined period of time does not decrease below a minimum threshold. The processor 110 can also increment the elapsed wall clock time by the estimated wall clock time taken to complete the simulation of the predetermined period of time, but may not increment the simulated time. The values for the elapsed wall clock time and simulated time can be stored, displayed to the user, and/or used to forecast a remaining time to complete the simulation of the reservoir simulation model. From here, the processor 110 can return to step 410 and evaluate the stochastic model for the new, decreased predetermined period of time.

If the solution to the simulation during the predetermined period of time is determined to converge, the processor 110 can increase or grow the predetermined period of time by a calculated or user-determined growth factor. The growth factor can have a minimum or maximum threshold so that the increased predetermined period of time does not increase above a maximum threshold. The increased predetermined period of time can be used when performing the next evaluation of the stochastic model, if any. The processor 110 can also increment the elapsed wall clock time by the estimated wall clock time taken to complete the simulation of the predetermined period of time, and can increment the simulated time by the current predetermined period of time. The values for the elapsed wall clock time and the simulated time can be stored, displayed to the user, and/or used to forecast a remaining time to complete the simulation of the reservoir simulation model.

From here, the processor 110 can proceed to step 430 where it can determine if the stochastic model has been evaluated for the entire simulation. Such a determination can be made, for example, by comparing the simulated time of the stochastic model to the given end time of the simulation. If evaluation of the stochastic model is not complete, the processor 110 can return to step 410 and repeat the process outlined above. If evaluation of the stochastic model is complete, processor 110 can proceed to step 440 and can use the total elapsed wall clock time, the total simulated time, one or more of the random variables, and/or other calculated results to determine a relationship between the wall clock time and the simulated time and/or forecast a remaining time to complete the simulation of the reservoir simulation model. The forecasted remaining time can be displayed to the user, for instance through one or more output device 142, and/or stored in a local or remote storage medium.

Figure 5:
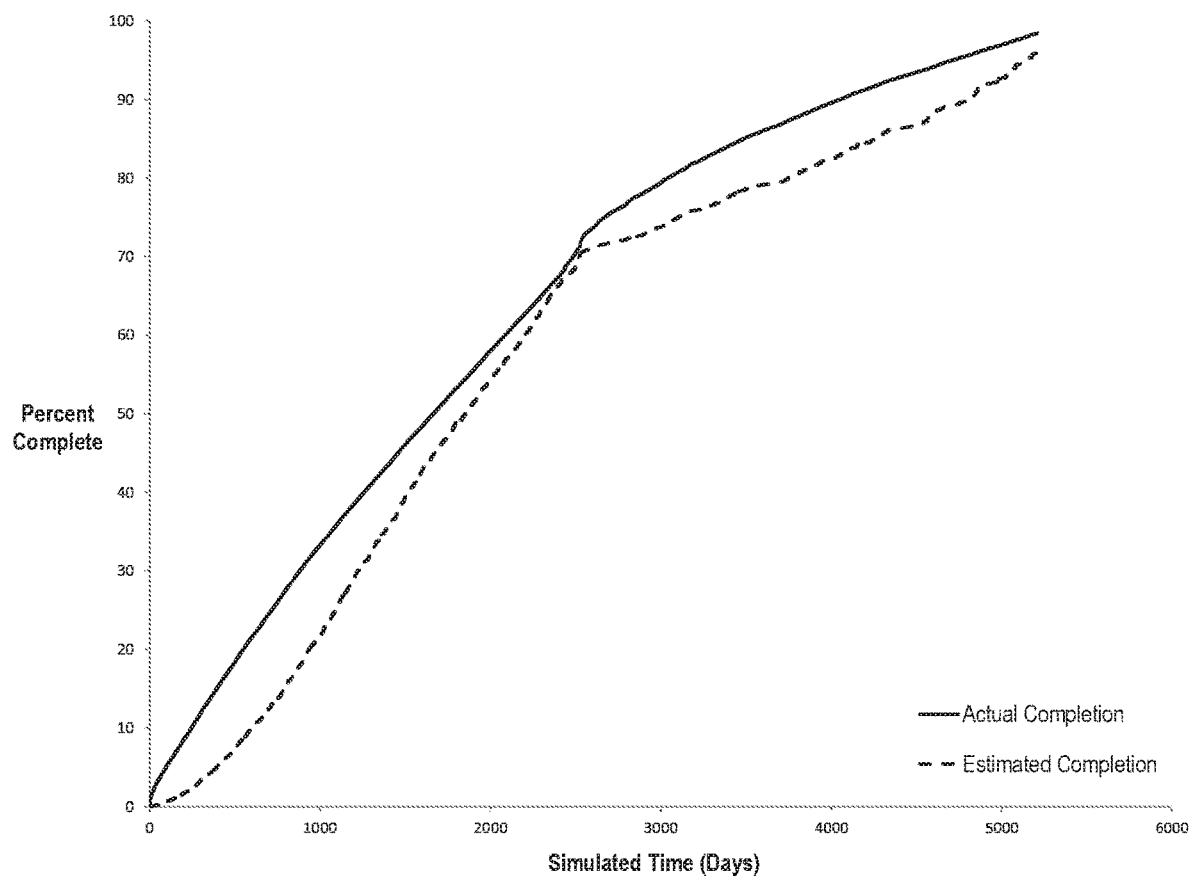
FIG. 5 is a graphical representation of an actual completion and an estimated completion for an example simulation of a reservoir simulation model.

FIG. 5 is a graphical representation of an actual completion and an estimated completion for an example simulation of a reservoir simulation model. The x-axis can represent the simulated time in days of the reservoir simulation model. The y-axis can represent the percentage of the simulation that has been completed. The actual completion percentage can be determined after completion of the simulation and can be calculated, for instance by the processor 110, by dividing the elapsed wall clock time by the total wall clock time taken to complete the simulation. The estimated time (shown in dashed lines) can be calculated using any of the methods described herein.

To facilitate a better understanding of the present disclosure, the following example of certain aspects of the present disclosure is given. In no way should the following example be read to limit, or define, the scope of the disclosure.

EXAMPLE

The present example is based on hypothetical inputs, and the results are produced via executing a computer-based stochastic programming routine that can be incorporated within a reservoir simulator.

As the reservoir simulator starts, the reservoir simulator produces an evolving state-of-the-reservoir by advancing through time in discrete time intervals called timesteps. Each timestep represents a projection forward obtained by solving a coupled system of non-linear partial differential equations. The solution over each timestep is obtained by an iterative scheme which itself has multiple nested iterative schemes. All of these iterative schemes within a timestep must converge or reach a satisfactory state in order to obtain a successful timestep solution. As such, the time step size is highly variable and only partially controlled by the user, and is also a strong function of the difficulty of the solution which itself is a function of many things. The criteria for convergence are programmed into the simulator for which parameters can be set by the user as part of the input data for the simulation, or can be defaulted by the simulator if required parameters are not specifically set by the user. The user also enters the end date for the simulation as part of the input data. The simulator can report, through a graphical interface (GUI), a dialog, and/or a text, an estimate of the wall clock time remaining to complete the simulation. The remaining time may also be expressed as a percentage of the simulation that has been completed.

During the simulation process, the simulator keeps records of the progress of the simulator. This data is also typically provided to the user in the form of a data file or through a GUI. An example of progress data output by the simulator is shown in Table I.

medium, and the like. At step 600, the stochastic model can be initialized, such as by initializing the stochasticPrediction function. Next, the reservoir simulator can start a reservoir simulation (step 605) and can set the time to solve for the reservoir simulation, t, to an initial time $t_0$ (step 610). Time $t_0$ can be, for example, the start time of the reservoir simulation. At step 615, the reservoir simulator can run a reservoir simulation solver to compute a solution to the simulation at time t. The computation can include solving a coupled system of non-linear partial differential equations. The solution can be a converged solution and can be obtained by an iterative scheme which itself has multiple nested iterative schemes.

At step 620, stochasticPrediction can be evaluated at least once to predict the simulation process from time t unto the final end time of the simulation, $t_{end}$. Next, stochasticPredicion can obtain an estimate for the total wall clock time taken to simulate from time t up to $t_{end}$ in step 625 based on the results from step 620. If stochasticPrediction is evaluated more than once, an average of the total wall clock times estimated by the function can be used to get a more realistic value of wall clock time required to complete the simulation. In either case, the progress of the simulation can be reported as an estimated wall clock time remaining for the simulation to complete or as a percentage of the simulation completed

TABLE I

EXAMPLE OF SIMULATION PROGRESS DATA OUTPUT FROM RESERVOIR SIMULATOR

| Timestep Number | Timestep Repetitions | Newton Iterations | Cumulative Simulation Time (days) | Date | CPU Time (ms) | Elapsed Time (ms) |
|---|---|---|---|---|---|---|
| 1 | 0 | 3 | 0.100 | Apr. 4, 2004 | 47.14 | 47.38 |
| 2 | 0 | 2 | 0.170 | Apr. 4, 2004 | 53.95 | 54.20 |
| 3 | 0 | 2 | 0.311 | Apr. 4, 2004 | 60.72 | 60.97 |
| 4 | 1 | 2 | 0.385 | Apr. 4, 2004 | 70.93 | 71.25 |
| 5 | 0 | 1 | 0.453 | Apr. 4, 2004 | 77.41 | 77.73 |
| 6 | 0 | 2 | 0.519 | Apr. 4, 2004 | 83.83 | 84.20 |
| 7 | 0 | 2 | 0.651 | Apr. 4, 2004 | 90.59 | 90.97 |
| 8 | 1 | 2 | 0.760 | Apr. 4, 2004 | 101.1 | 101.5 |
| 9 | 0 | 2 | 0.872 | Apr. 4, 2004 | 107.9 | 108.3 |
| 10 | 0 | 1 | 0.950 | Apr. 4, 2004 | 114.3 | 114.8 |
| 11 | 0 | 1 | 0.996 | Apr. 4, 2004 | 117.7 | 118.2 |
| 12 | 0 | 1 | 1.069 | Apr. 5, 2004 | 121.0 | 121.5 |
| 13 | 0 | 2 | 1.215 | Apr. 5, 2004 | 127.8 | 128.3 |
| 14 | 0 | 2 | 1.509 | Apr. 5, 2004 | 134.7 | 135.2 |
| 15 | 1 | 1 | 1.581 | Apr. 5, 2004 | 141.8 | 142.3 |
| 16 | 0 | 1 | 1.668 | Apr. 5, 2004 | 145.3 | 145.8 |
| 17 | 0 | 1 | 1.842 | Apr. 5, 2004 | 152.1 | 152.6 |
| 18 | 0 | 2 | 2.190 | Apr. 6, 2004 | 159.2 | 159.8 |
| 19 | 1 | 1 | 2.228 | Apr. 6, 2004 | 166.1 | 166.7 |
| 20 | 0 | 1 | 2.276 | Apr. 6, 2004 | 169.5 | 170.1 |
| 21 | 0 | 1 | 2.373 | Apr. 6, 2004 | 173.0 | 173.7 |
| 22 | 0 | 1 | 2.565 | Apr. 6, 2004 | 176.7 | 177.3 |
| 23 | 0 | 2 | 2.949 | Apr. 6, 2004 | 183.8 | 184.5 |
| 24 | 1 | 1 | 3.043 | Apr. 7, 2004 | 194.4 | 195.1 |

In this example reservoir simulator, a function, hereinafter called stochasticPrediction, provides a method to stochastically model the simulation process in terms of the relationship between the wall clock time and the simulated time, between given values of start and end values of simulated time.

Figure 6:
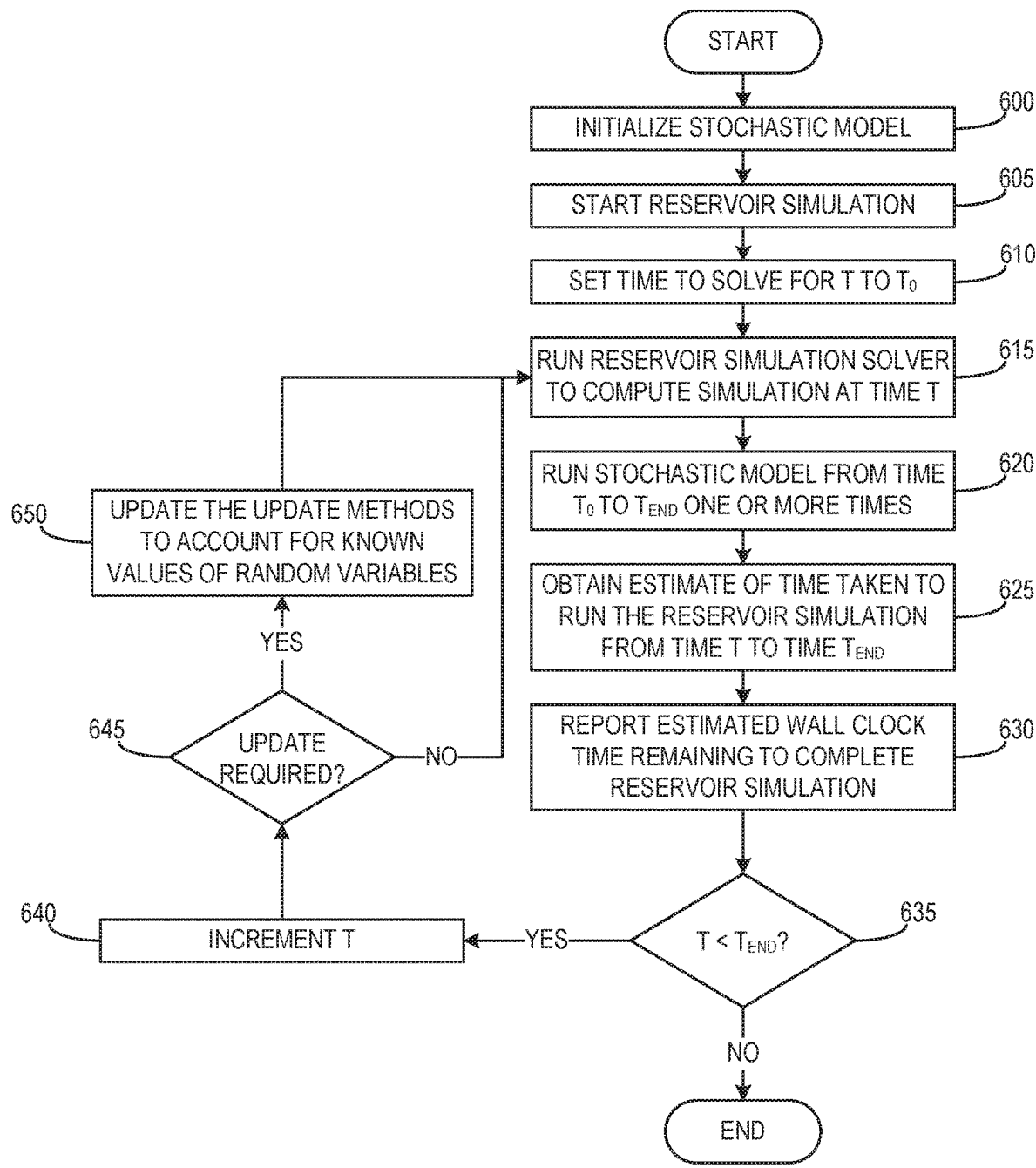
FIG. 6 illustrates an example process for stochastically modeling the simulation process using the function stochasticPrediction of the Example.

FIG. 6 illustrates an exemplary process for stochastically modeling the simulation process in the example reservoir simulator using the stochasticPrediction function. Such a process can be executed by a processor associated with the reservoir simulator using instructions stored on a storage and/or remaining in step 630. These values can be continuously updated as the simulation advances to newer timesteps.

At step 635, the time t can be compared to $t_{end}$ to determine if the reservoir simulation has finished. If the reservoir simulation is complete, the simulation can be stopped and the results can be presented to a user. If the reservoir simulation is not complete, the process can proceed to step 640 and can increment time t by a predetermined or calculated timestep. Next, it can be determined if the update methods for the stochastic model need to be updated in step 645. If no updating is needed, the process can return to step 615 and repeat the process described above. If updating is needed, such as in cases where Bayesian updating is used, the update methods of the stochastic model can be updated in step 650 to account for the known values of random variables based on information determined during one or more previous timesteps. From here, the process can return to step 615 and repeat the process described above.

The function stochasticPrediction simulates the progress of the simulation in terms of elapsed wall clock and simulation time, given the simulation start and finish times as arguments, named respectively tStartSimulation and tEndSimulation, both given in simulated time in units of days. Definitions for these and other variables used by the stochasticPrediction function are summarized in Table II.

The algorithm for stochasticPrediction in the present example can begin by initializing maxNewtons, tau, a, dtMax, dtMin, dtGrowthFactor, dtmaxNew, minAlpha, maxAlpha to constant scalar values as per user-entered parameters for the simulation period between tStartSimulation and tEndSimulation. Next, stochasticPrediction can initialize tElapsed to 0 and dtSolve to 0. From here, stochasticPrediction can run a While loop that ends when the condition tSolve≥tEndSimulation is met. Inside this loop, the following steps can be run in sequence:

Set n to an updated value of n;
Set isConverged to an updated value of isConverged;
Set epsilon to an updated value of epsilon;
Set alpha to an updated value of alpha;
If isConverged is TRUE, then set dtElapsed=n*tau*(1+epsilon) and dtSolve=dtmaxNew, else set dtElapsed=maxNewtons*tau*(1+epsilon);
If isConverged is TRUE, then set dtMaxNew=the smaller of dtMax and dtGrowthFactor*dtMaxNew, else set dtMaxNew=the larger of alpha*dtMaxNew and dtMin;
Set tSolve=dtSolve+tSolve;
Set tElapsed=dtElapsed+tElapsed;
Store values of tElapsed and tSolve.

TABLE II

DEFINITIONS OF VARIABLES

| Variable | Definition |
|---|---|
| MaxNewtons | Maximum number of Newton iterations allowed in advancing to the next timestep. |
| Tau | Mean time taken to solve one Newton iteration (in seconds) |
| n | Number of Newton iterations taken to reach convergence. |
| dtMax | Max size (in simulated days) of timestep allowed in advancing the simulation to the next timestep. |
| dtMin | Min size(in simulated days) of timestep allowed in advancing the simulation to the next timestep. |
| dtGrowthFactor | Factor by which a timestep size can be multiplied to advance the simulation to the next timestep, used when convergence is achieved for a timestep. The advance is capped by dtMax. |
| minAlpha | Smallest factor by which a timestep size can be chopped to advance the simulation to the next timestep. Timestep chopping is used when convergence is not achieved for a timestep in the maximum number of Newton iterations allowed, so that a smaller timestep must be attempted. |
| maxAlpha | Largest factor by which a timestep size can be chopped to advance the simulation to the next timestep. Timestep chopping is used when convergence is not achieved for a timestep in the maximum number of Newton iterations allowed, so that a smaller timestep must be attempted to advance the simulator. |
| tElapsed | Elapsed wall clock time (in seconds). |
| dtElapsed | Increment of elapsed wall clock time (in seconds). |
| epsilon | Stochastic part of wall clock time taken to solve one Newton iteration. |
| alpha | Fraction of dtMax by which a new timestep simulation is attempted on non-convergence at a given timestep. |
| isConverged | Boolean variable that has the value of TRUE, if the set of Newton iterations at a timestep have converged, according to the criteria set in the simulator input or defaulted values if no specific value shave been entered by the user as part of the input data for simulation, otherwise isConverged has the value FALSE. |

In this example, the calculation of dtMaxNew is taken to be dtSolve for the next timestep (i.e. in the next iteration of the While loop). This is done to account for that on not reaching convergence, the next timestep has to be chopped subject to a minimum of dtMin, otherwise it is to be advanced by a growth factor on current dtSolve subject to a maximum of dtMax. However, non-convergence at a timestep is not the only reason to chop or grow timesteps. Other reasons, such as a user specification, can also affect timestep size. In such cases, the user-specified value can be specified for dtMaxNew and dtSolve in the while loop. If these are not known, an updated values method can be used to model these two variables through suitable probability distributions. These concepts can be captured by the same variable isConverged. Further, quantities that are known to affect timestep size, such as grid block volumes, how fast the principal and secondary variables are changing, and what types of physical processes are occurring, can also be accounted for by the stochasticPrediction function. This could be achieved by introducing new variables in the stochasticPrediction function or by changing the update methods for one or more of the random variables.

Additionally, the updated values of n, isConverged, epsilon, and alpha, shown in the algorithm described above can be calculated in various ways. In some cases, the updated values can assume the values obtained at a previous timestep. For example, it may be assumed that at the timestep for which the simulation process is being predicted by the function stochasticPrediction, the same number of Newton iterations can be performed as during the simulation process for the previous timestep (information which is known during the simulation process). Similarly, it may be assumed that if the simulation of the previous timestep converged, the simulation can converge at the current timestep as well. Moreover, for the random variables epsilon and alpha, values can be assumed to be the same as those determined during the previous timestep (information which is known during the simulation process).

In some cases, the number of Newton iterations required at the current timestep could be assumed to follow a discrete uniform distribution with a minimum of 1 and a maximum of maxNewtons. Similarly, isConverged, indicating whether the set of Newton iterations at current timesteps result in convergence, can be assumed to follow a uniform distribution that can take a value of TRUE or FALSE. In such a case, the probability of getting a convergence can follow the same distribution as that for getting a 'tail' when tossing a fair coin. If one or more random variables are known to follow more complex processes, such as Poisson process or Poisson process with jumps, a suitable update method for those variables can be used. The update method can utilize one or more sampling methods to ensure that the relevant random variable follows a given probability distribution. Any robust sampling method, such as Monte Carlo, Latin Hypercube, Hammersley Squares and the like, can be used to draw a sample from the probability distribution given in the update method for a random variable (i.e., n, isConverged, epsilon, or alpha).

Between the cases where the random variables of the stochastic model are either completely determined by the previous outcomes or are completely independent of the previous outcomes, there are other possible ways of calculating the values. For example, one or more of the random variables can be updated by the Bayesian method as the simulation proceeds and outcomes for the previous timesteps become known. During the Bayesian update step, the known value of the random variable obtained by the simulator at one or more previous timesteps can be used to update the probability distribution for the random variable. In cases of Bayesian updating (also known as "Bayesian Inference"), the probability distribution ("prior density") for the random variable assumed to be true at the beginning of the simulation can be deformed as it gets updated to a new distribution ("posterior density") by the actual realized value ("observed data"), which can be known at every timestep as the simulation progresses forward.

Figure 7:
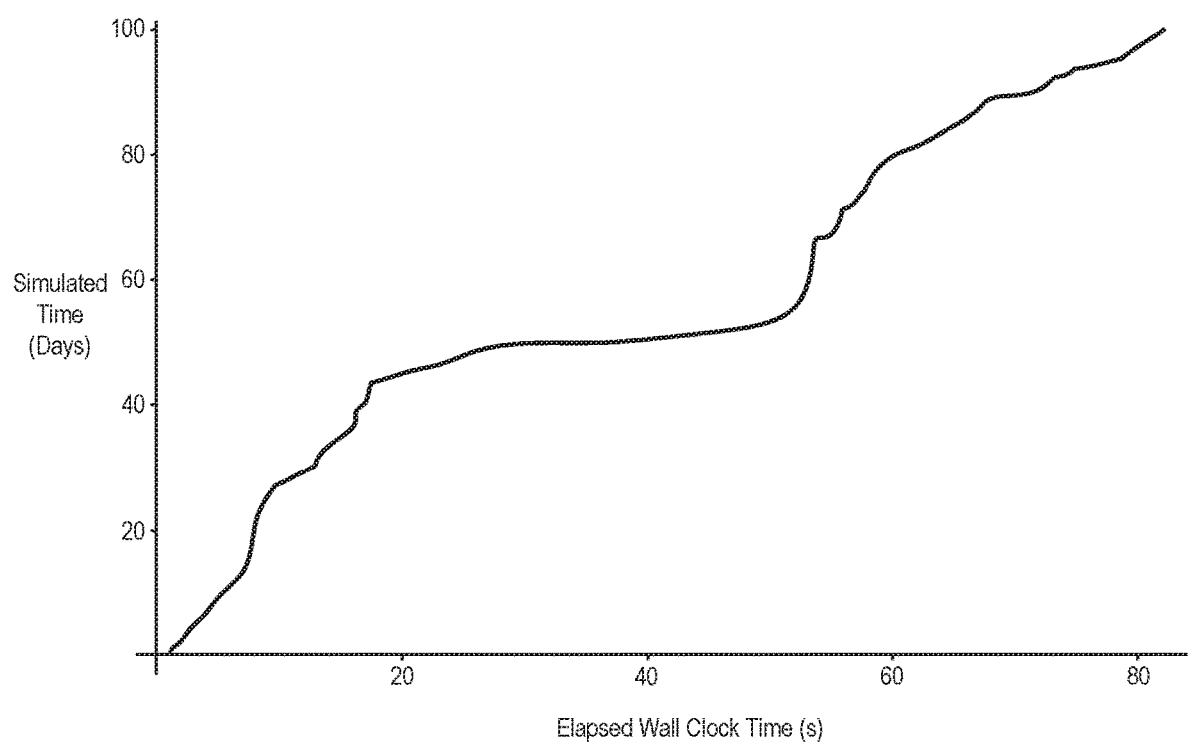
FIG. 7 is a graphical representation of simulation time and wall clock time from one embodiment of the function stochasticPrediction of the Example.

An example plot of simulation time and wall clock time from one realization of the function stochasticPrediction is shown in FIG. 7. The values shown in this plot are obtained using the algorithm described above to evaluate a simulation between a simulation time of 0 days and 100 days. The random variables in this example are assumed to follow a probabilistic distribution, without updating with observed data.

Methods according to the aforementioned description can be implemented using computer-executable instructions that are stored or otherwise available from computer readable media. Such instructions can comprise instructions and data which cause or otherwise configure a general purpose computer, special purpose computer, or special purpose processing device to perform a certain function or group of functions. Portions of computer resources used can be accessible over a network. The computer executable instructions may be binaries, intermediate format instructions such as assembly language, firmware, or source code. Computer-readable media that may be used to store instructions, information used, and/or information created during methods according to the aforementioned description include magnetic or optical disks, flash memory, USB devices provided with non-volatile memory, networked storage devices, and so on.

For clarity of explanation, in some instances the present technology may be presented as including individual functional blocks including functional blocks comprising devices, device components, steps or routines in a method embodied in software, or combinations of hardware and software.

The computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Devices implementing methods according to these disclosures can comprise hardware, firmware and/or software, and can take any of a variety of form factors. Such form factors can include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device.

The instructions, media for conveying such instructions, computing resources for executing them, and other structures for supporting such computing resources are means for providing the functions described in these disclosures.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. Rather, the described features and steps are disclosed as possible components of systems and methods within the scope of the appended claims. Moreover, claim language reciting "at least one of" a set indicates that one member of the set or multiple members of the set satisfy the claim.

Statements of the Disclosure Include:

Statement 1: A method comprising: running, by a processor, a simulation of a reservoir simulation model for a first predetermined period of time associated with a first computation step of the simulation, measuring a performance result of the simulation for the first predetermined period of time, the performance result comprising an elapsed time and a timespan simulated, and forecasting, based on the performance result, a remaining time to complete the simulation of the reservoir simulation model.

Statement 2: The method according to Statement 1, further comprising: prior to running the simulation, determining a plurality of parameters from the reservoir simulation model, and calculating, based on the parameters, an estimated time to complete the simulation of the reservoir simulation model.

Statement 3: The method according to Statement 1 or 2, further comprising: detecting a change in one or more of the plurality of parameters, and updating, based on the change, the estimated time to complete the simulation of the reservoir simulation model.

Statement 4: The method according to any of the proceeding Statements 1-3, further comprising: calculating a simulation model complexity score based on at least one of a model size, a well type, a level of well control, a pressure-volume-temperature type, a relative permeability type, a porosity type, a geomechanical type, and a thermal type.

Statement 5: The method according to any of the proceeding Statements 1-4, further comprising: generating a stochastic model of the simulation of the reservoir simulation model, the stochastic model comprising a plurality of random variables, executing, by the processor, the stochastic model to determine a converging solution to one or more of the plurality of random variables of the stochastic model, and forecasting, based on the converging solution, the remaining time to complete the simulation of the reservoir simulation model.

Statement 6: The method according to any of the proceeding Statements 1-5, further comprising: allocating computing resources for the simulation based on the remaining time to complete the simulation of the reservoir simulation model.

Statement 7: The method according to any of the proceeding Statements 1-6, further comprising: determining a plurality of characteristics associated with an oil or gas field, the oil or gas field comprising at least one of a reservoir, a well, and a surface facility, generating the reservoir simulation model based on the plurality of characteristics, and determining a plurality of parameters associated with the reservoir simulation model, the plurality of parameters comprising at least one of a number of components, a number of gridblocks, a number of processors, a timespan of the simulation of the reservoir simulation model, a hardware factor, a surface network complexity, and a displacement type.

Statement 8: The method according to any of the proceeding Statements 1-7, wherein determining the plurality of characteristics comprises calculating one or more oil or gas field characteristics based on data sensed via one or more sensors.

Statement 9: The method according to any of the proceeding Statements 1-8, further comprising: running, by the processor, the simulation of the reservoir simulation model for a second predetermined period of time associated with a second computation step of the simulation, measuring a second performance result of the simulation for the second predetermined period of time, and forecasting, based on the second performance result, the remaining time to complete the simulation of the reservoir simulation model after the second predetermined period of time.

Statement 10: The method according to any of the proceeding Statements 1-9, further comprising: calculating a moving average of the performance result and the second performance result, updating, based on the moving average, the remaining time to complete the simulation of the reservoir simulation model.

Statement 11: The method according to any of the proceeding Statements 1-10, further comprising: when the remaining time is above a threshold, modifying one or more parameters from the reservoir simulation model to yield an updated reservoir simulation model, running a second simulation of the updated reservoir simulation model for a second predefined period of time associated with at least one computation step of the simulation, and forecasting an updated remaining time to complete the second simulation of the updated reservoir simulation model.

Statement 12: A system comprising: a processor, and a computer-readable storage medium having stored therein instructions which, when executed by the processor, cause the processor to perform operations comprising: executing a simulation of a reservoir simulation model for a first predetermined period of time associated with a first computation step of the simulation, calculating a performance result of the simulation for the first predetermined period of time, the performance result comprising an elapsed wall clock time and a timespan simulated, and predicting, based on the performance result, a remaining time to complete the simulation of the reservoir simulation model.

Statement 13: The system according to Statement 12, wherein prior to running the simulation, the processor determines a plurality of parameters from the reservoir simulation model and calculates, based on the parameters, an estimated time to complete the simulation of the reservoir simulation model.

Statement 14: The system according to Statements 12 or 13, wherein the processor detects a change in one or more of the plurality of parameters and updates, based on the change, the estimated time to complete the simulation of the reservoir simulation model.

Statement 15: The system according to any of the proceeding Statements 12-14 further comprising: a sensor coupled to the processor for sending data sensed at an oil or gas field to the processor.

Statement 16: The system according to any of the proceeding Statements 12-15, wherein the processor determines a plurality of characteristics associated with the oil or gas field based on the data received from the sensor and generates the reservoir simulation model based on the plurality of characteristics.

Statement 17: A non-transitory computer-readable storage medium having stored therein instructions which, when executed by a processor, cause the processor to perform operations comprising: running a simulation of a reservoir simulation model for a first predetermined period of time associated with a first computation step of the simulation, measuring a performance result of the simulation for the first predetermined period of time, the performance result comprising an elapsed wall clock time and a timespan simulated, and forecasting, based on the performance result, a remaining time to complete the simulation of the reservoir simulation model.

Statement 18: The non-transitory computer-readable storage medium according to Statement 17, storing additional instructions which, when executed by the processor, cause the processor to perform operations comprising: prior to running the simulation, determining a plurality of parameters from the reservoir simulation model, and calculating, based on the parameters, an estimated time to complete the simulation of the reservoir simulation model.

Statement 19: The non-transitory computer-readable storage medium according to Statements 17 or 18, storing additional instructions which, when executed by the processor, cause the processor to perform operations comprising: detecting a change in one or more of the plurality of parameters, and updating, based on the change, the estimated time to complete the simulation of the reservoir simulation model.

Statement 20: The non-transitory computer-readable storage medium according to any of the proceeding Statements 17-19, storing additional instructions which, when executed by the processor, cause the processor to perform operations comprising: allocating computing resources for the simulation based on the remaining time to complete the simulation of the reservoir simulation model.

What is claimed:
1. A method comprising:
  determining a plurality of characteristics comprising a number and type of processors utilized by a reservoir simulation system that is associated with an oil or gas field, the oil or gas field comprising at least one of a reservoir, a well, and a surface facility;
  generating a reservoir simulation model based on the plurality of characteristics;
  running, by a processor, a simulation of the reservoir simulation model for a first predetermined period of time associated with a first computation step of the simulation;
  measuring a performance result of the simulation for the first predetermined period of time, the performance result comprising an elapsed time, a total timespan of the simulation, and a timespan simulated up to the elapsed time; and forecasting, based on the performance result, a remaining time to complete the simulation of the reservoir simulation model during the running of the simulation of the reservoir simulation model, the forecasting of the remaining time to complete the simulation comprising:
calculating a quotient by dividing the total timespan of the simulation by the timespan simulated up to the elapsed time;
calculating a difference by subtracting one from the quotient; and
calculating a product by multiplying the difference by the elapsed time.

2. The method of claim 1, further comprising:
prior to running the simulation, determining a plurality of parameters from the reservoir simulation model; and
calculating, based on the plurality of parameters, an estimated time to complete the simulation of the reservoir simulation model.

3. The method of claim 2, further comprising:
detecting a change in one or more of the plurality of parameters; and
updating, based on the change, the estimated time to complete the simulation of the reservoir simulation model.

4. The method of claim 1, further comprising:
calculating a simulation model complexity score based on at least one of a model size, a well type, a level of well control, a pressure-volume-temperature type, a relative permeability type, a porosity type, a geomechanical type, and a thermal type.

5. The method of claim 1, further comprising:
generating a stochastic model of the simulation of the reservoir simulation model, the stochastic model comprising a plurality of random variables;
executing, by the processor, the stochastic model to determine a converging solution to one or more of the plurality of random variables of the stochastic model; and
forecasting, based on the converging solution, the remaining time to complete the simulation of the reservoir simulation model.

6. The method of claim 1, further comprising:
allocating computing resources for the simulation based on the remaining time to complete the simulation of the reservoir simulation model.

7. The method of claim 1, further comprising:
determining a plurality of parameters associated with the reservoir simulation model, the plurality of parameters comprising at least one of a number of components, a number of gridblocks, a number of processors, a timespan of the simulation of the reservoir simulation model, a hardware factor, a surface network complexity, and a displacement type.

8. The method of claim 7, wherein determining the plurality of characteristics comprises calculating one or more oil or gas field characteristics based on data sensed via one or more sensors.

9. The method of claim 1, further comprising:
running, by the processor, the simulation of the reservoir simulation model for a second predetermined period of time associated with a second computation step of the simulation;
measuring a second performance result of the simulation for the second predetermined period of time; and forecasting, based on the second performance result, the remaining time to complete the simulation of the reservoir simulation model after the second predetermined period of time.

10. The method of claim 9, further comprising:
calculating a moving average of the performance result and the second performance result;
updating, based on the moving average, the remaining time to complete the simulation of the reservoir simulation model.

11. The method of claim 1, further comprising:
when the remaining time to complete the simulation is above a threshold, modifying one or more parameters from the reservoir simulation model to yield an updated reservoir simulation model;
running a second simulation of the updated reservoir simulation model for a second predefined period of time associated with at least one computation step of the simulation; and
forecasting an updated remaining time to complete the second simulation of the updated reservoir simulation model.

12. A system comprising:
a processor; and
a computer-readable storage medium having stored therein instructions which, when executed by the processor, cause the processor to perform operations comprising:
determining a plurality of characteristics comprising a number and type of processors utilized by a reservoir simulation system that is associated with an oil or gas field, the oil or gas field comprising at least one of a reservoir, a well, and a surface facility;
generating a reservoir simulation model based on the plurality of characteristics;
executing a simulation of the reservoir simulation model for a first predetermined period of time associated with a first computation step of the simulation;
calculating a performance result of the simulation for the first predetermined period of time, the performance result comprising an elapsed wall clock time, a total timespan of the simulation, and a timespan simulated up to the elapsed wall clock time; and
predicting, based on the performance result, a remaining time to complete the simulation of the reservoir simulation model during the executing of the simulation of the reservoir simulation model, the predicting of the remaining time to complete the simulation comprising:
calculating a quotient by dividing the total timespan of the simulation by the timespan simulated up to the elapsed wall clock time;
calculating a difference by subtracting one from the quotient; and
calculating a product by multiplying the difference by the elapsed wall clock time.

13. The system of claim 12, further comprising determining a plurality of parameters associated with the reservoir simulation model, the plurality of parameters comprising at least one of a number of components, a number of gridblocks, a number of processors, a timespan of the simulation of the reservoir simulation model, a hardware factor, a surface network complexity, and a displacement type.

14. The system of claim 13, wherein the processor detects a change in one or more of the plurality of parameters and updates, based on the change, the estimated time to complete the simulation of the reservoir simulation model.

15. The system of claim 12, further comprising:
a sensor coupled to the processor for sending data sensed at an oil or gas field to the processor.

16. The system of claim 15, wherein the processor determines a plurality of characteristics associated with the oil or gas field based on the data received from the sensor and generates the reservoir simulation model based on the plurality of characteristics.

17. A non-transitory computer-readable storage medium having stored therein instructions which, when executed by a processor, cause the processor to perform operations comprising:
  determining a plurality of characteristics comprising a number and type of processors utilized by a reservoir simulation system that is associated with an oil or gas field, the oil or gas field comprising at least one of a reservoir, a well, and a surface facility;
  generating a reservoir simulation model based on the plurality of characteristics;
  running a simulation of the reservoir simulation model for a first predetermined period of time associated with a first computation step of the simulation;
  measuring a performance result of the simulation for the first predetermined period of time, the performance result comprising an elapsed wall clock time, a total timespan of the simulation, and a timespan simulated up to the elapsed wall clock time; and
  forecasting, based on the performance result, a remaining time to complete the simulation of the reservoir simulation model during the running of the simulation of the reservoir simulation model, the forecasting of the remaining time to complete the simulation comprising:
    calculating a quotient by dividing the total timespan of the simulation by the timespan simulated up to the elapsed wall clock time;
    calculating a difference by subtracting one from the quotient; and
    calculating a product by multiplying the difference by the elapsed wall clock time.

18. The non-transitory computer-readable storage medium of claim 17, storing additional instructions which, when executed by the processor, cause the processor to perform operations comprising:
  determining a plurality of parameters associated with the reservoir simulation model, the plurality of parameters comprising at least one of a number of components, a number of gridblocks, a number of processors, a timespan of the simulation of the reservoir simulation model, a hardware factor, a surface network complexity, and a displacement type.

19. The non-transitory computer-readable storage medium of claim 18, storing additional instructions which, when executed by the processor, cause the processor to perform operations comprising:
  detecting a change in one or more of the plurality of parameters; and
  updating, based on the change, the estimated time to complete the simulation of the reservoir simulation model.

20. The non-transitory computer-readable storage medium of claim 17, storing additional instructions which, when executed by the processor, cause the processor to perform operations comprising:
  allocating computing resources for the simulation based on the remaining time to complete the simulation of the reservoir simulation model.

* * * * *